United States Patent [19]

Ramachandran et al.

[11] Patent Number: 5,066,926
[45] Date of Patent: Nov. 19, 1991

[54] SEGMENTED CASCODE HBT FOR MICROWAVE-FREQUENCY POWER AMPLIFIERS

[75] Inventors: Ravi Ramachandran, San Jose; Allen F. Podell, Palo Alto, both of Calif.

[73] Assignee: Pacific Monolithics, Sunnyvale, Calif.

[21] Appl. No.: 588,766

[22] Filed: Jun. 26, 1990

[51] Int. Cl.$^5$ .............................................. H03F 3/04
[52] U.S. Cl. ..................... 330/311; 330/286; 330/295; 330/124 R
[58] Field of Search ............ 330/31, 286, 295, 124 D, 330/124 R; 357/34

[56] References Cited

U.S. PATENT DOCUMENTS

| | | | |
|---|---|---|---|
| 4,667,166 | 5/1987 | Itoh | 330/311 |
| 4,728,902 | 3/1988 | Gleason | 330/311 |
| 5,001,534 | 3/1991 | Lumardi | 357/34 |

Primary Examiner—Eugene R. LaRoche
Assistant Examiner—R. Ratliff
Attorney, Agent, or Firm—Edward B. Anderson

[57] ABSTRACT

A cascode transistor configuration includes an input terminal for receiving the input signal, an output terminal for outputting the output signal and bass and emitter terminals connectable to ground. Each of a predetermined plurality of common-base heterojunction bipolar transistors (HBTs) has a base coupled to the base terminal, and a collector coupled to the support output terminal. Each of the predetermined plurality of common-emitter HBTs is associated with one of the common-base HBTs. Each common-emitter HBT also has a base coupled to the input terminal, an emitter coupled to the emitter terminal, and a collector coupled to only the emitter of the associated common-base HBT.

2 Claims, 1 Drawing Sheet

SEGMENTED CASCODE HBT FOR MICROWAVE-FREQUENCY POWER AMPLIFIERS

FIELD OF THE INVENTION

This invention relates to cascode amplifiers, and in particular, segmented cascode heterojunction bipolar transistors (HBT) for use in microwave-frequency power amplifiers.

BACKGROUND OF THE INVENTION

A configuration of transistors known as a cascode configuration provides an amplifier with a low input capacitance and a high input resistance. A simplified example of such a configuration, referred to generally as a cascode transistor, is shown in an amplifier in FIG. 1. The common-emitter transistor receives an input signal on its base and provides current gain to the amplifier. The common-base transistor has an emitter coupled to the collector of the common-emitter transistor and a collector that outputs the amplified signal. It provides the voltage gain of the cascode structure. The gain of the cascode configuration is the product of the current gain of the common-emitter transistor, and the voltage gain of the common-base transistor.

In order to obtain a conventional cascode amplifier with increased power capabilities, the common-emitter and common-base transistors of FIG. 1 are each replaced with a plurality or bank of like transistors connected in parallel as shown in FIG. 2. In this configuration each "transistor" has an increased power-handling capability due to the sharing of current flow between associated parallel transistors. The respective bases, collectors and emitters of each bank of transistors are connected, providing for common biasing and equal performance so long as the individual transistors within a bank operate substantially identically and share the current equally.

However, if there is an imbalance between the power-conducting common-base transistors, the one conducting more current becomes warmer. This in turn causes it to conduct more current, reducing the current conducted by the other parallel transistors. This reaction accelerates, a process known as thermal runaway, until secondary breakdown occurs in the transistor. Gallium arsenide is the semiconductor used almost exclusively in microwave applications due to its higher electron mobility and substantially reduced losses. Thermal runaway is more severe in a gallium arsenide transistor due to its reduced thermal conductivity as compared with Silicon.

What is needed therefore is a high power amplifier with the characteristics of a cascode configuration of gallium arsenide transistors that is safely operable at microwave frequencies.

SUMMARY OF THE INVENTION

The present invention overcomes these disadvantages of the prior art. In particular, the present invention provides a cascode configuration that has current-limited common-base transistors and that is operable at microwave frequencies.

These features are provided in the present invention by a new cascode configuration of heterojunction bipolar transistors (HBTs). HBTs are found to be useful because they do not exhibit the capacitance of normal bipolar transistors, thereby allowing operation at higher frequencies.

The present invention provides a cascode configuration that limits the current in the power transistors, avoiding thermal runaway. This configuration includes an input terminal for receiving the input signal, an output terminal for outputting the output signal, and base and emitter terminals connectable to ground. Each of a predetermined plurality of common-base heterojunction bipolar transistors (HBTs) have a base coupled to the base terminal and a collector coupled to the output terminal. The invention also includes the predetermined plurality of common-emitter HBTs, with each common-emitter HBT being associated with one of the common-base HBTs. Each common-emitter HBT also has a base coupled to the input terminal, an emitter coupled to the emitter terminal, and a collector coupled to only the emitter of the associated common-base HBT. Current flowing in each common-base HBT is the same as the current flowing in each common-emitter HBT, thereby limiting the current flow in each power-conducting common-base HBT. The use of HBTs made on gallium arsenide also enables use of the transistor with microwave-frequency signals.

These and other features and advantages of the present invention will be apparent from the following detailed description of the preferred embodiment and associated drawings.

DETAILED DESCRIPTION OF THE PREFERRED EMBODIMENT

Figure 1:
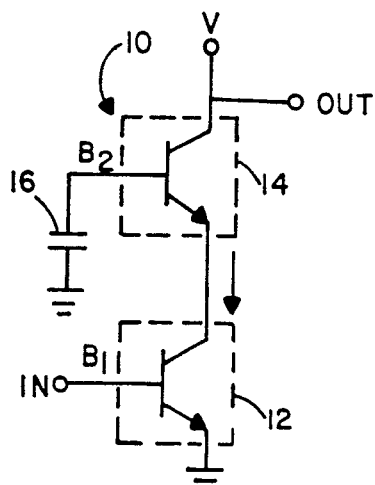
FIG. 1 is a general schematic of a conventional cascode amplifier.

Referring initially to FIG. 1, a conventional cascode amplifier 10 is shown having a common-emitter bipolar transistor 12 connected to a common-base bipolar transistor 14. An input signal is fed into the base of transistor 12. The collector of transistor 12 is connected to the emitter of transistor 14. The base of transistor 14 is coupled to ground through a capacitor 16. A D.C. bias voltage is applied to the collector of transistor 14, which is also the output terminal.

Figure 2:
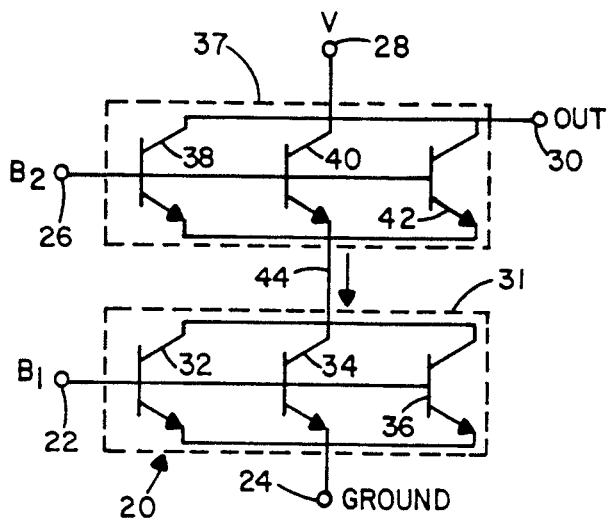
FIG. 2 is a schematic of a conventional power cascode transistor for use in the amplifier of FIG. 1.

In order to amplify signals of greater power using the cascode configuration, transistors 12 and 14 are extended by using the cascode transistor configuration 20 of FIG. 2. This configuration has an input terminal 22, shown as $B_1$, an emitter ground terminal 24, a base ground terminal 26, shown as $B_2$, a D.C. bias terminal 28, shown as V, and an output terminal 30.

Transistor 12 is replaced by a plurality or bank 31 of common-emitter transistors, such as transistors 32, 34 and 36. The collectors, emitters and bases of these transistors are all respectively connected, so that the collection or bank 31 of transistors operates like original transistor 12, but conducts more current. Similarly, transistor 14 is replaced by bank 37 of transistors 38, 40 and 42 connected together as transistors 32, 34 and 36 are connected together.

The total current conducted by common-emitter transistors 32, 34 and 36, which is the same total current conducted by common-base transistors 38, 40 and 42, is transmitted between the two banks of transistors by a single conductor 44. If the transistors in each respective bank of transistors are identical, they will conduct identically. Variations between the transistors causes an imbalance in the current conducted, potentially resulting in thermal runaway, as has been discussed previously.

Figure 3:
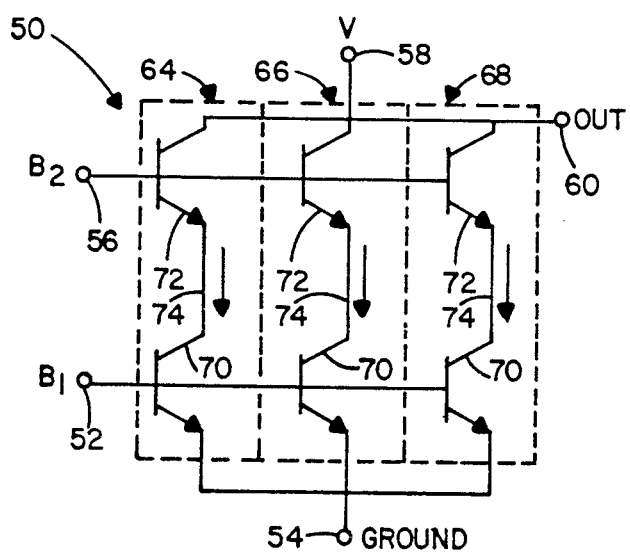
FIG. 3 is a schematic of a power cascode transistor made according to the invention.

FIG. 3 illustrates a segmented cascode transistor 50, which, when made with HBTs, is thermally stable and operable at microwave frequencies. Transistor 50 includes terminals 52, 54, 56, 58 and 60 with function and connection similar to the corresponding terminals, as shown, of transistor configuration 20.

However, rather than providing a plurality of each of transistors 12 and 14, there are a plurality of the cascode configuration of transistors, referred to as cells, such as cells 64, 66 and 68. Each cell includes a common-emitter transistor 70 having a collector coupled only to the emitter of an associated common-base transistor 72.

The respective bases and emitters of transistors 70 are connected together, at the respective terminals, as shown. The respective bases and collectors of transistors 72 are similarly connected together. However, for the three cells shown in FIG. 3, there is a separate conductor 74 that connects the collector of a common-emitter transistor 70 with the emitter of the associated common-base transistor 72.

The configuration of cascode transistor cells 64, 66 and 68 limits the current conducted in the common-base transistor 72 to the current level of the common-emitter transistor 70. The common-emitter transistor, having a fixed bias, acts as a current source, preventing thermal runaway. By connecting the respective bases, emitters and collectors to the external terminals, operation of the cells is unified. However, the tolerance of the circuit to transistor differences is greater. No common-base transistor can dominate current conduction, since the cells function independently.

Further, by using heterojunction bipolar transistors made on a gallium arsenide substrate for transistors 70 and 72 in each cell, a sufficiently low capacitance exists to operate the overall cascode transistor 50 at microwave frequencies.

It will be apparent to one skilled in the art that variations in form and detail may be made in the preferred embodiment without varying from the spirit and scope of the invention as defined in the claims. The application of this segmentation technique may be extended to silicon, indium phosphide, germanium-silicon, or any other bipolar power transistors susceptible to secondary breakdown. The preferred embodiment is thus provided for purposes of explanation and illustration, but not limitation.

We claim:

1. A segmented cascode transistor for microwave-frequency power amplifiers for producing an amplified output signal from an input signal, comprising:
    an input terminal for receiving the input signal;
    an output terminal for outputting the output signal;
    a base terminal connectable to ground;
    an emitter terminal connectable to ground;
    a predetermined plurality of common-base heterojunction bipolar transistor means (HBTs), each common-base HBT having a base coupled to a base terminal, and a collector coupled to the output terminal; and
    the predetermined plurality of common-emitter HBTs, each common-emitter HBT being associated with one of the common-base HBTs, and having a base coupled to the input terminal, an emitter coupled to the emitter terminal, and a collector coupled to only the emitter of the associated common-base HBT;
    whereby current flowing in each common-base HBT is the same as the current flowing in each associated common-emitter HBT.

2. A microwave-frequency power amplifier for producing an amplified output signal from an input signal, comprising:
    an input terminal for receiving the input signal;
    an output terminal for outputting the output signal;
    a predetermined plurality of common-base heterojunction bipolar transistor means (HBTs), each common-base HBT having a base coupled to ground and a collector coupled to the output terminal; and
    a predetermined plurality of common-emitter HBTs, each common-emitter HBT being associated with one of the common-base HBTs, and having a base coupled to the input terminal, an emitter coupled to ground, and a collector coupled to only the emitter of the associated common-base HBT;
    whereby current flowing in each common-base HBT is the same as the current flowing in each associated common-emitter HBT.

* * * * *